United States Patent [19]
Partridge

[11] Patent Number: 6,104,106
[45] Date of Patent: *Aug. 15, 2000

[54] SOLID STATE CIRCUIT BREAKER

[76] Inventor: Donald F. Partridge, 26758 Adams Rd., Los Gatos, Calif. 95030

[ * ] Notice: This patent issued on a continued prosecution application filed under 37 CFR 1.53(d), and is subject to the twenty year patent term provisions of 35 U.S.C. 154(a)(2).

[21] Appl. No.: 08/889,276

[22] Filed: Jul. 8, 1997

Related U.S. Application Data

[63] Continuation of application No. 08/736,268, Oct. 24, 1996, abandoned, which is a continuation of application No. 08/524,050, Sep. 6, 1995, abandoned, which is a continuation of application No. 08/365,983, Dec. 28, 1994, abandoned, which is a continuation of application No. 08/031,553, Mar. 15, 1993, abandoned.

[51] Int. Cl.$^7$ ....................................................... H02J 3/14
[52] U.S. Cl. ........................... 307/126; 307/130; 361/61; 361/76; 323/901
[58] Field of Search .................................. 307/130, 131, 307/132 R, 139, 140, 141, 141.4, 126; 361/13, 56, 57, 59, 60, 61, 76, 91, 100, 101; 323/241, 235, 239, 319, 901, 908

[56] References Cited

U.S. PATENT DOCUMENTS

| | | | |
|---|---|---|---|
| 3,558,982 | 1/1971 | Greenwood | 361/58 |
| 3,558,983 | 1/1971 | Steen | 361/58 |
| 3,725,742 | 4/1973 | Pollard | 361/91 |
| 3,796,890 | 3/1974 | Thompson et al. | 361/91 |
| 4,084,207 | 4/1978 | Piccone et al. | 361/91 |
| 5,216,352 | 6/1993 | Studtman et al. | 323/241 |

FOREIGN PATENT DOCUMENTS 0 448 201  6/1992  European Pat. Off. .

OTHER PUBLICATIONS

Smith, R. K., et al., "Solid State Distribution Current Limiter and Circuit Breaker: Application Requirements and Control Strategies", IEEE/PES 1992 Summer Meeting, Seattle, WA, Jul. 12–16, 1992.

General Electric, "SCR Manual, Including Triacs and Other Thyristors, Sixth Edition", Prentice–Hall (1982), pp. 231–244; 276–280.

Brambilla, et al., "Snubber Circuit Design for GTO Converters", Proceedings of the International Conference on Industrial Electronics, Control and Instrumentation (Oct. 28–Nov. 1, 1991), vol. 1 of 3, IEEE, pp. 668–673.

Hashii, et al., "New Approach to a High–Power GTO PWM Inverter for AC Motor Drives", IEEE Transactions on Industry Applications (Mar. 1987), vol. 1A–23, No. 2, pp. 263–269.

*Primary Examiner*—Albert W. Paladini
*Attorney, Agent, or Firm*—Fliesler Dubb Meyer & Lovejoy

[57] ABSTRACT

A switching circuit that is particularly applicable to high voltage 3 phase solid state circuit breakers (SSCB). The circuit comprises a solid state switch; an energy absorbing device connected in parallel with said switch to form a parallel combination; an inductor connected in series with said parallel combination; and a control circuit connected to said solid state switch and adapted to turn off said switch in response to a predetermined voltage/current condition.

63 Claims, 5 Drawing Sheets

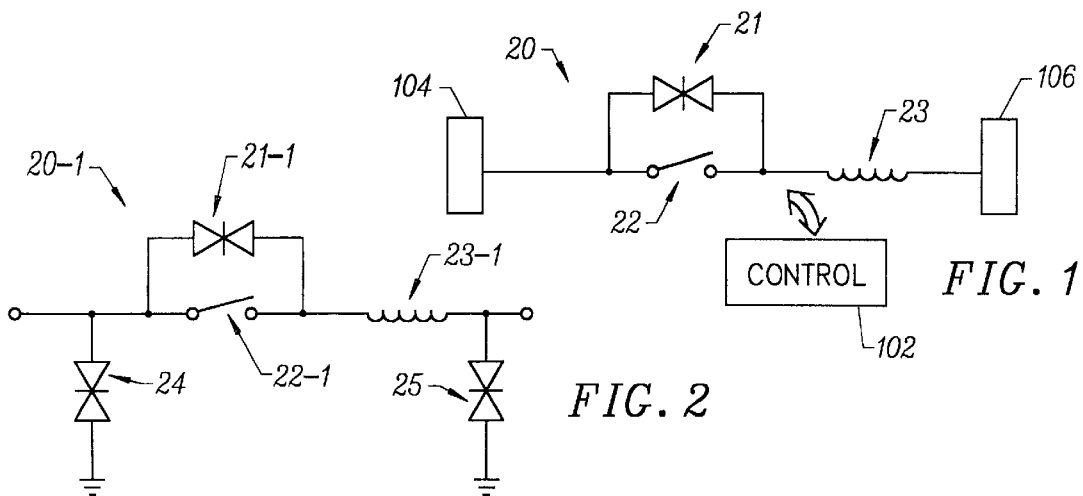
FIG. 1
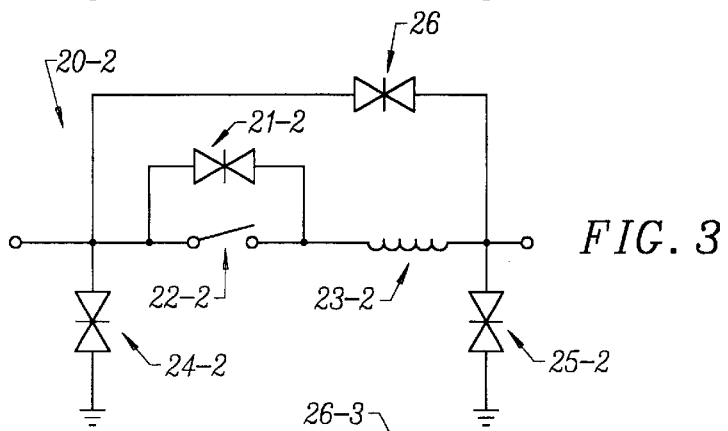
FIG. 2
FIG. 3
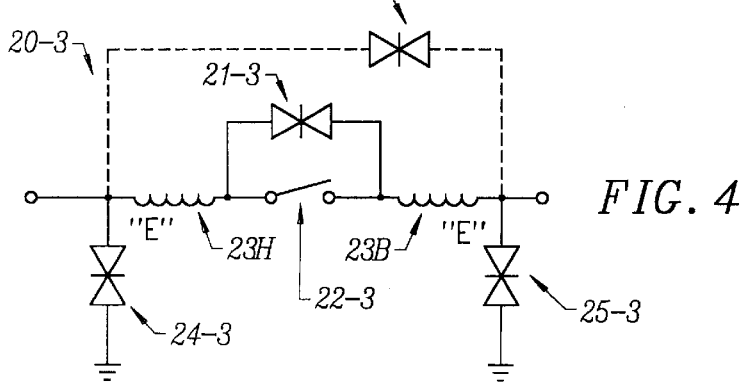
FIG. 4
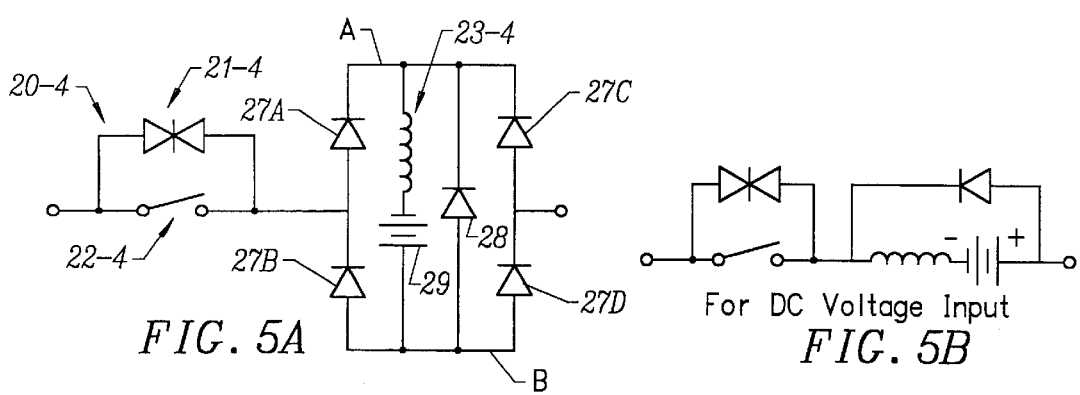
FIG. 5A
FIG. 5B

SOLID STATE CIRCUIT BREAKER

This application is a continuation of Ser. No. 08/736,268, filed Oct. 24, 1996, now abandoned, which is a continuation of Ser. No. 08/524,050, filed Sep. 6, 1995, now abandoned, which is a continuation of Ser. No. 08/365,983, filed Dec. 28, 1994, now abandoned, which is a continuation of Ser. No. 08/031,553, filed Mar. 15, 1993, now abandoned.

BACKGROUND

1. Field of the Invention

The invention relates primarily to the field of solid state high power circuit breakers.

2. Description of Related Art

A solid state circuit breaker (SSCB), especially for high voltage 3 phase applications, has been a dream of power engineers for many years. The existing mechanical breakers used today have to live through some major transient conditions. Some are:

1. Lightning strikes/voltage transients that generate very high voltages.

2. Extremely high short circuit current before the breaker has time to open.

3. Very high inrush current when the breaker is first turned on.

4. High energy absorption during the time the mechanical breaker is opening and clearing the arcs. If the breaker opening takes place during a high short current interval, the energy is very high.

Because of these conditions and others the mechanical breakers are limited in the number of times they can operate before they fail. Further, there is significant maintenance cost.

The object of the present patent is the design of an SSCB that will function under harsh conditions and operate a very high number of times. A further object of this patent is to incorporate a soft start feature that limits the inrush current when the breaker is first turned on. A major area of application of this patent application is 3 phase high voltage applications. It also works with DC inputs (high and low voltages). Under some conditions this type of breaker is the only way of interrupting a stiff DC source quickly.

A typical rating for an SSCB would be to open in 1 to 30 microseconds (us) with 600 amps at 26,000 volts. The basic concepts covered in this patent will work at any voltage and current. Many problems have to be solved in order to design a SSCB.

The first problem that has to be solved when working with an SSCB is the delay time of the semiconductors being used. There is at least a three orders of magnitude difference in response time between FET's and GTO's. A FET's delay time can be as short as 10 nanoseconds where a GTO's delay time can be as long as 30 microseconds. (delay time being the time between when the semiconductor circuit starts to turn off and is supporting full voltage). The concepts of this patent work for tubes also (both gas and vacuum).

An SCR's delay time can be anything from 0.5 microseconds to several hundred microseconds depending on the SCR used and how it is commutated. The combination of an SCR and so called DC side type commutation circuit duplicates the action of a fast semiconductor switch when being turned off. (i.e. in the order of 0.5 microseconds the load is receiving no energy from the input power source—said otherwise—the SCR in conjunction with the DC side commutation circuit supports full voltage in 0.5 microseconds). The basic idea of DC side commutation is that the commutation voltage is induced in series with the SCR instead of in parallel.

The basic problem that a long delay time causes is that the current through the semiconductor will get too high before the switch can turn off. For example, if a 20,000 volt source (AC or DC) was short circuited the di/dt could easily be 10,000 amps per microsecond. If just solid state switches rated for 600 amps and a delay time of 1 microsecond were used in series with the voltage source then the current would be 10,000 amps before the switch was off. Most practical 600 amp switches can not handle a 10,000 amp surge during the turn off process. The problem becomes how do you slow down the di/dt without affecting the normal operation of the SSCB and the circuit it is protecting. The higher the input voltage the more important the delay time problem becomes because the higher the di/dt can be with a dead short.

Another problem that has to be solved is how do you protect the semiconductors when lightning or other high voltage transients are injected into the SSCB system. Lightning strikes can cause 150,000 volt spikes with a rise time of 0.4 microseconds and currents of 100,000 amps for 50 microseconds time duration. It is not practical to rate most high voltage SSCB's to handle voltages and currents of these magnitudes.

A third problem is how do you absorb the energy stored in the inductance of a power system. Said otherwise, if you turn off the SSCB very fast, how do you absorb the energy stored in the system inductances without causing high voltages on the semiconductors themselves?

Another major problem that has to be solved is how do you limit the inrush currents in the SSCB when the SSCB is first turned on and still get the SSCB fully on in a short time (i.e. an effective soft start method). Normal inrush currents are 10 to 30 times the rated current of a breaker. Without a soft start feature the cost of the SSCB would be very high or some sort of compromise would have to be made in the operation of the SSCB.

SUMMARY OF THE INVENTION

According to the invention, roughly described, a solid state switching circuit comprises a solid state switch; an energy absorbing device connected in parallel with said switch to form a parallel combination; an inductor connected in series with said parallel combination; and a control circuit connected to said solid state switch and adapted to turn off said switch in response to a predetermined voltage/current condition.

BRIEF DESCRIPTION OF THE DRAWINGS

FIG. 1 is a schematic diagram of a SSCB embodying the present invention wherein the four major problems associated with high voltage SSCB's are all solved at the same time.

FIG. 2 is a schematic diagram of a SSCB embodying the present invention, which is a modification of the circuit shown in FIG. 1 and particularly illustrates a method of limiting the voltage caused by lightning strikes.

FIG. 3 is a schematic diagram of a SSCB embodying the present invention, which is a further modification of the circuit shown in FIG. 1 where the high voltage caused by lightning strikes is further limited beyond that of FIG. 2.

FIG. 4 is a schematic diagram of a SSCB embodying the present invention which is a modification of the circuit shown in FIG. 3 where a major problem caused by lightning strikes on magnetic components is solved.

FIG. 5A is a schematic diagram of a SSCB embodying the present invention which is a modification of the circuit shown in FIG. 1 and shows a method of decoupling the effect of the inductor of FIG. 1 unless the load current goes above the design level of the SSCB.

FIG. 5B is similar to FIG. 5A for D.C. voltage input.

DETAILED DESCRIPTION OF PREFERRED EMBODIMENTS

Figure 6:
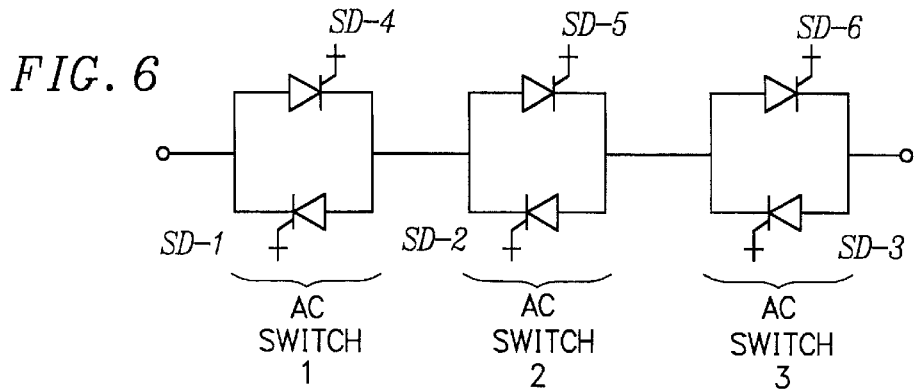
FIG. 6 shows one possible configuration of three series connected AC switches made of GTO's that could be used for switch 22 of FIG. 1.

Illustrated in FIG. 1 is a switching circuit 20 that can be used as a Solid State Circuit Breaker (SSCB). The circuit consists of energy absorbing device 21, switch 22, inductor 23 and control circuit 102. The basic circuit solves the four major problems of high voltage SSCB's. They are:

1. To passively limit the current that is drawn from the voltage source 104 between the time a fault appears on the line and switch 22 can be opened.

2. To limit the voltage on the switch 22 during a voltage transient, lightning strike or when switch 22 is turned off.

3. To absorb the energy stored in the inductor 23 and the line inductance when the switch 22 turns off.

4. To limit the inrush current to the load 106 when the SSCB is first turned on (i.e. active current limiting to give a soft start or turn on).

No matter what type of switch is used, there is a delay time from when the switch starts to turn off and when the switch supports the input voltage (in the case of SCR's with DC side commutation—when the SCR's in conjunction with the commutation circuit support the input voltage).

With a dead short across the output of the SSCB—the current rises quickly. If the delay time is long and/or the voltage is high the current can rise to a very high value during the delay time. In the case of a 20,000 volt input voltage with a dead short, the current could get to 10,000 amps in one microsecond (us). Note that first order this is independent of the current rating of the breaker itself. In a 3 phase system this could happen if some power factor correction capacitors were connected near the input of the breaker and the hard short were put near the output of the breaker. Stated otherwise—in high voltage applications and/ or where the switch has a long delay time the current increase in the switch during the delay time is too high to use just a switch in series with the voltage source being protected.

A solution to the delay problem is to add an inductor in series with the switch. To that end inductor 23 is shown in FIG. 1 to be in series with switch 22. The size of the inductor 23 is determined by the delay time of switch 21 and the voltage of the system being protected. The higher the voltage and the longer the delay time, the bigger inductor 23 has to be. A typical size inductor would be 1 millihenry (mh) in a 26,000 volt system with 1 to 10 us delay time. In a 26,000 volt 600 amp 3 phase system the output voltage will drop to 25,999 volts due to the injection of a 1 mh inductor. The one 1 volt drop assumes that the power factor of the load current is near 1. Inductor 23 passively limits the current during the delay time.

When working with a 1 us delay time, 1 mh inductor 23 and a 20,000 source voltage, the increase in the current with a dead short across the output terminals in 1 us is only 20 amps. At 10 us delay time the increase current would be 200 amps. The significant point of the inductor is that you can limit the current during an output short and have small effect on the output voltage of a high voltage SSCB. When the inductor starts to have too large an effect on the output voltage then decoupling methods are available that will be described when FIGS. 5A and 5B are explained. Decoupling methods are methods of having an inductor in series with the switch 22 but not affecting the output voltage unless the current goes above the trip level of the SSCB.

When switch 22 of circuit 20 opens, there is energy stored in inductor 23 and the line inductance in series with the SSCB. In many applications the inductance in series with SSCB is much larger than inductor 23. This stored energy will be absorbed in energy absorbing device 21. The energy absorbing device 21 can be a ZnO based device, two opposing series connected zener diodes, two opposing series connected avalanche diodes and/or other circuits and devices. The voltage generated across the energy absorbing device has to be less than the voltage rating of the switch 22.

Switch 22 can be series connected GTO's, SCR's, MCT's, IGBT's, FET's, bi-polar transistors and/or other type switches both of semiconductor and non-semiconductor based construction. When the SSCB is being used for AC applications, switch 22 can be anti-parallel connected series strings of the same devices or series connections of AC switches such as that shown in FIG. 7. In the case of SCR's it can be the series connections of AC switches like that shown in FIGS. 8 and 8a.

In AC applications the SCR's can also be just anti-parallel connected series strings that are line commutated if the inductor 23 is large enough. The energy absorbing device 21 is still required to limit the voltage across switching device 22 under transient voltage conditions and lightning strikes.

The combination of the inductor 23 and energy absorbing device 21 also solves the transient voltage and/or lightning strike problem. If lightning strikes when the switch 22 is open, then the voltage across the switch 22 will be limited by how much current goes through the energy absorbing device 21. The current through the energy absorbing device is controlled by how big the inductor 23 is and, if a core material is used, whether it is allowed to saturate or not.

If lightning strikes when the switch 22 is on, then the delay time comes into play again along with the time the lightning strikes generate a voltage on the SSCB system. With 150,000 volt lightning strike hitting a 20,000 volt rated system the change in current during the delay time can be 7.5 times or more higher than with just a shorted line. This assumes the lightning strike lasts for a longer time than the delay time. If the energy absorbing device 21 is sized for the current of a shorted line at turn off then the size of inductor 23 will have to be 7.5 times as big to limit the current to what it was with just a shorted line at a given delay time. One way to limit the size of inductor 23 due to lightning strike is to limit the voltage generated by the lightning strike itself.

Shown in FIG. 2 is circuit 20-1. It is a modification of circuit 20 with like parts labeled with a -1. In circuit 20' two additional energy absorbing devices have been added. They are energy absorbing devices 24 and 25. These devices limit the voltage generated by the lightning strike. With the lightning strike voltage limited, the increase (if any) in size of inductor 23-1 is reduced. The ground shown in circuit 20-2 could be the ground of a 3 phase system.

Circuit 20-2 shown in FIG. 3 is a modification of circuit 20-1 with like parts shown with a -2. (i.e. switch 22-1 of circuit 20-1 is labeled 22-2 in circuit 20-2). To further limit the voltages across switch 22-2 another energy absorbing device 26 has been added to circuit 20-2. Another configuration to limit the voltage due to lightning strikes keeps energy absorbing device 26 but takes out energy absorbing devices 24-2 and 25-2. To those skilled in the art other ways of limiting the voltage due to voltage transients and lightning strikes across inductor 23-2 will come to mind. Note that both energy absorbing devices 24-2 and 25-2 are not necessarily required if you know on which side of the SSCB the lightning will strike.

When the SSCB turns on the active current limiting action (soft start) of SSCB's like those shown in FIGS. 1,2 and 3 can be accomplished in several ways. The method chosen depends on the type of switches used and how they can be turned off. Cost is also a factor. Active current limiting action can be used at two different times with an SSCB. The level of the current limiting does not have to be the same during the two areas of application nor do they have to keep the same level in one area of application. The two times are:

1. When the SSCB is first turned on.
2. When the SSCB is automatically turning back on after being tripped with an over current sense, high di/dt sense or other appropriate trip input.

When the SSCB is automatically turned back on into an over current condition, it can be left in active current limiting or turned off after a fixed length of time if the current does not drop below the active current limiting trip level.

There are two basic methods of controlling the current when the SSCB is in the active current limiting mode. They are to force the current to zero in the switches 22, 22-1 and 22-2 in FIGS. 1, 2, and 3 as a function of the current itself (i.e. to turn the switches off in the same manner as they are turned off in a fault condition). The second way is when using devices that can be phase controlled (i.e. SCR's and GTO's) to phase control the switching devices and only use the forced commutation means when the phase control is not fast enough to keep the current under control. The reason for the two approaches is that the cost of the components to current limit using forced commutation on a continuous active current basis is much more than components that force commutate at a much lower repetition rate. Phase controlling SCR's and GTO's only requires extra logic. With phase control for active current limiting, the components necessary for forced commutation of SCR's and GTO's have to only be rated for a very low repetition rate.

With AC SSCB's the forced commutation methods for active current limiting do not have to be in sink with the line and the SSCB can be turned off as a function of the current. With phase control current limiting the switching devices are turned on as a function of the currents.

One preferred method of getting a soft start using forced commutation with three phase applications is to turn on two phases at a zero voltage crossing and if no current limit is detected, the third phase at its zero crossing. If current limit is detected then turn off all phases and then turn on the next two phases to have a zero voltage crossing. Continue this process until no current limit is reached for a time longer than one full cycle. You then convert to how ever you want the SSCB to operate in its normal mode of operation.

Note that this current limiting action (i.e. soft start) is perfect for motor starting, transformer turn on current inrush control and similar applications. Stated otherwise, no motor starters are needed when using this type of SSCB or this type of SSCB can be used as a motor starter/current limiter.

Shown in FIG. 4 is circuit 20-3. It is a modification of circuit 20-2 with like parts labeled with a -3. (i.e. switch 22-2 of circuit 20-2 is labeled 22-3 in circuit 20-3). In circuit 20-3 of FIG. 4 the inductor 23-2 of FIG. 3 has been split into two parts. The two parts are labeled 23A and 23B in FIG. 4. One end of both 23A and 23B are labeled with an "E".

When high voltage transformers are connected to power lines that lightning can hit, special attention has to be taken with the ends of the transformer windings that connect to the power lines. Lightning can cause very high dv/dt's. With high dv/dt's the first few turns of the end of the winding that will experience the strike will arc over if they are not wound spaced much further apart than is necessary for the rest of the turns of the given winding. This has been known for many years.

In the same manner and for the same reasons the ends labeled "E" of inductors 23A and 23B of FIG. 4 have to be spaced out. You could use one inductor with both ends spaced like the "E" ends of 23A and 23B but the switch 22-3 would not be protected as well. Further the speed of response of energy absorbing device 21-3 does not have to be as fast with inductors on each side of switching device 22-3. If it is known that lightning will not hit one end of the SSCB then one inductor can be used with one end spaced.

Shown in FIG. 5A is circuit 20-4. It is another modification of circuit 20 in FIG. 1 with like parts shown with a -4. (i.e. switch 22 of circuit 20 is labeled switch 22-4 in circuit 20-4). When circuit conditions are such that inductor 23 of FIG. 1 has to be bigger than is acceptable to the SSCB user then decoupling methods have to be used. The circuit shown in circuit 20-4 is one method of decoupling inductor 23-4. To decouple means to arrange the circuitry around inductor 23-4 in such a way that the inductor has little or no effect on the output voltage unless the load current goes above the design level of the SSCB. The circuit of FIG. 5A will work with AC or DC input voltages.

The decoupling circuit works in the following manner. Inductor 23-4, DC source 29 and diode 28 form a closed loop. The DC source 29 voltage is set to a value that will cause the DC current flowing through the series circuit of DC source 29, diode 28 and inductor 23-4 to be more than the peak current rating of the SSCB.

With the current in inductor 23-4 more than the current to the load of the SSCB there will always be current flowing in diode 28. With the current higher in inductor 23-4 than the load, the combination of inductor 23"", DC source 29 and diode 28 is the equivalent of a small DC source equal to the voltage drop across diode 28. In this way inductor 23 has no effect on the output voltage with a large change in load current (i.e.—inductor 23-4 is decoupled).

Diodes 27 A-B-C-D form a full bridge network that rectify the SSCB currents when the input voltage is AC. If the input voltage is DC with the positive connected to switch 22-4 then all the diodes starting with 27 can be taken out. Point A of the bridge would be connected to switch 22-4 and point B would be the output terminal. Another decoupling method would be running inductor 23-4 saturated with the over saturating current being equal to or higher than the peak rating of the SSCB. Other methods of decoupling will be evident to those skilled in the art.

Another decoupling circuit that works especially well with AC SSCB's is the same as circuit 20-4 with the exception that DC source 29 is shorted out. In this arrangement inductor 23-4 is decoupled the vast majority of the time. The only time that it is not decoupled is for a short time when the AC current is at its peak value. It is during this short interval that inductor 23-4 has energy added to keep the current in inductor 23-4 equal to the peak AC current. Stated otherwise, with DC source 29 shorted out in circuit 20-4 the current in inductor 23-4 will stay equal to the peak current of the AC voltage source. In most cases the distortion caused in the output during the short interval (when the AC current is at its peak value) that energy is added to inductor 23-4 is acceptable.

Switches 22 through 22-4 of FIGS. 1 through 5A can be numerous arrangements of different types of switching devices depending on the type of SSCB (i.e. AC or DC) and depending on whether the switching devices have symmetrical voltage ratings (i.e. can they support as much reverse as forward voltage). FIG. 6 shows a switch arrangement for symmetrical devices where three devices are required in series and the SSCB is for AC applications (i.e. the SSCB carries AC currents). The six switches are labeled SD-1 through SD-6. The devices shown are GTO's but could be MCT's and other devices. If the SSCB was going to be used for DC applications then switching devices SD-4 through SD-6 would not be required unless the DC source were two quadrant. Even then switches SD-4 through SD-6 could be replaced with diodes in most applications.

Figure 7:
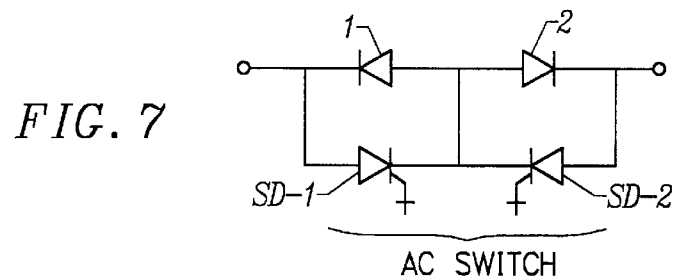
FIG. 7 shows one possible configuration of an AC switch using asymmetrically voltage rated GTO's that could be used for switch 22 of FIG. 1.

In FIG. 6 switches SD-1 and SD-4 constitute an AC switch using switching devices that have symmetrical voltage ratings. If asymmetrical GTO's were to be used then they could be arranged as shown in FIG. 7. In FIG. 7 the two asymmetrical GTO's are labeled SD-1 and SD-2. The two anti-parallel diodes are labeled 1 and 2.

The GTO's shown in FIG. 7 could also be FET's, IGBT's, Bi-polar transistors and other asymmetrical or symmetrical devices. The AC switch is well known. The AC switches like FIG. 7 can be put in series in the same manner that the three AC switches shown in FIG. 6 are.

The basic operation of FIG. 7 is simple. When the switches are turned on the current will flow through one switching device and the anti-parallel diode of the other switching device. If the current reverses direction then the opposite will happens (i.e. the current will flow through the other switching device and then through the diode that is in parallel with the switching device that was conducting before the current reversed direction). When the two switching devices in FIG. 7 are turned off then the switch will not conduct in either direction.

Figure 8:
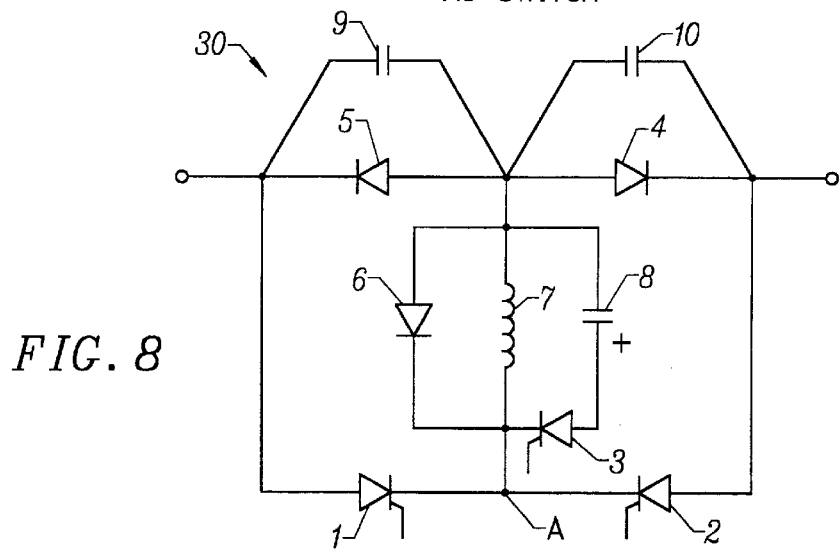
FIG. 8 and 8a are two versions of another AC switch, using SCR's that are to be forced commutated, that could be used for switch 22 of FIG. 1.

Another AC switch is shown in FIG. 8. This AC switch includes SCR's which have to be force commutated to be turned off quickly. If they are phase commutated the delay time can be very long (i.e.—over 8000 microseconds). When force commutated, the shortest delay time is obtained when using DC side commutation. DC side commutation simply means to induce a voltage in series with the SCR or SCR's to be commutated.

Shown in FIG. 8 is an AC switch called circuit 30. Circuit 30 is an AC or two quadrant DC switch and is another version of the AC switch shown in FIG. 7.

Circuit 30 consists of:

SCR's 1, 2 and 3

Diodes 4, 5 and 6

Inductor 7

Capacitors 8, 9 and 10

Capacitor 8 is held charged at the polarity indicated by high impedance circuitry not shown. The currents through the AC switch are as described for the AC switch shown in FIG. 7. That is, when current is flowing in one SCR it is also flowing through the diode connected to the other SCR. While doing this the current is also flowing through inductor 7. It should be noted that the direction of the current flow through inductor 7 is always in the same direction regardless of which SCR the current is flowing in.

In AC applications the current in inductor 7 is always higher than the current going through the switch itself except when the AC current in the switch is at its peak value. This is done in exactly the same way the current in inductor 23-4 of FIG. 6 is kept above the load current. If it is a DC application and/or the output voltage distortion caused by inductor 7 is too high for the end user, then a DC source similar to DC source 29 of FIG. 6 could be added to circuit 30 of FIG. 8. This will keep inductor 7 completely decoupled unless the current in the load goes above the design value of the SSCB itself.

Turning on SCR 3 in FIG. 8 commutates SCR's 1 and 2. Note that as soon as the voltage across capacitor 8 is applied across inductor 7, both SCR's are reversed biased and the AC switch is completely open at that time. The charge on capacitor 8 will discharge into inductor 7. The design is such that SCR's 1 and 2 will regain their blocking ability before the voltage on capacitor 8 drops low enough that the SCR's are forward biased. In practical terms the circuit shown in FIG. 8 duplicates the action of a fast AC switch with a delay time of 0.5 us (½ microseconds). When capacitor 8 discharges down to near zero volts, the current in inductor 7 is clamped in diode 6. The energy stored in inductor 7 will then be dissipated in inductor 7 itself and in diode 6. Note that SCR's 1 and 2 can have turnoff times of 100 us and more and the AC switch still has a turn off with a delay time of only 0.5 us. This is the major benefit of DC side commutation.

It should be noted that if SCR 3 was replaced with a FET type device and the layout of circuit 30 was carefully controlled then the delay time of circuit 30 could be in the order of 10 ns (10 nanoseconds). This is an extremely fast high power SSCB.

Circuit 30 is a power schematic and does not show normal filters. Further, it should be noted that diodes 4 and 5 could be avalanche diodes and/or energy absorbing devices could be used as filters as well as energy absorbing devices. Other components that would likely be used would be filters of one type or another across diodes 4, 5 and 6.

Figure 8A:
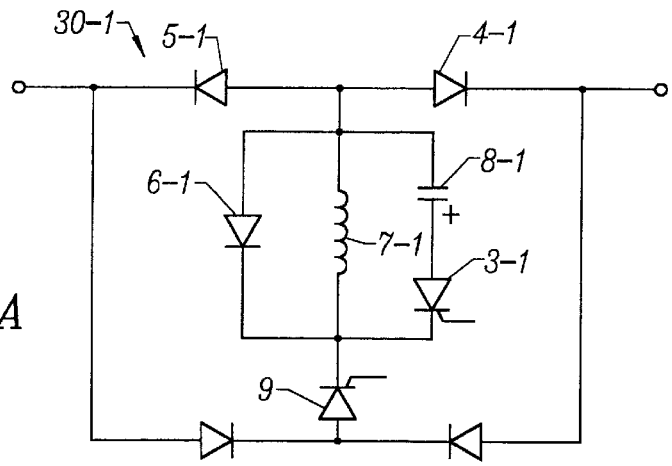

Shown in FIG. 8a is circuit 30-1. The circuit is a modification of circuit 30 of FIG. 8 with like parts labeled with a. Circuit 30-1 has two major changes compared to circuit 30. The two changes are:

1. SCR's 1 and 2 of circuit 30 have been replaced with diodes 7 and 8 in circuit 30-1.

2. A SCR 9 has been added to circuit 30-1.

Circuit 30-1 has some advantages and disadvantages over circuit 30 in FIG. 8. One advantage is that the circuit has only one SCR per AC switch. One disadvantage is that the circuit does not work well with phase control active current limiting without added circuitry. Another disadvantage is that there are more losses in the single SCR circuit. The circuit works in the same basic manner as FIG. 8 when it is forced commutated.

Figure 8B:
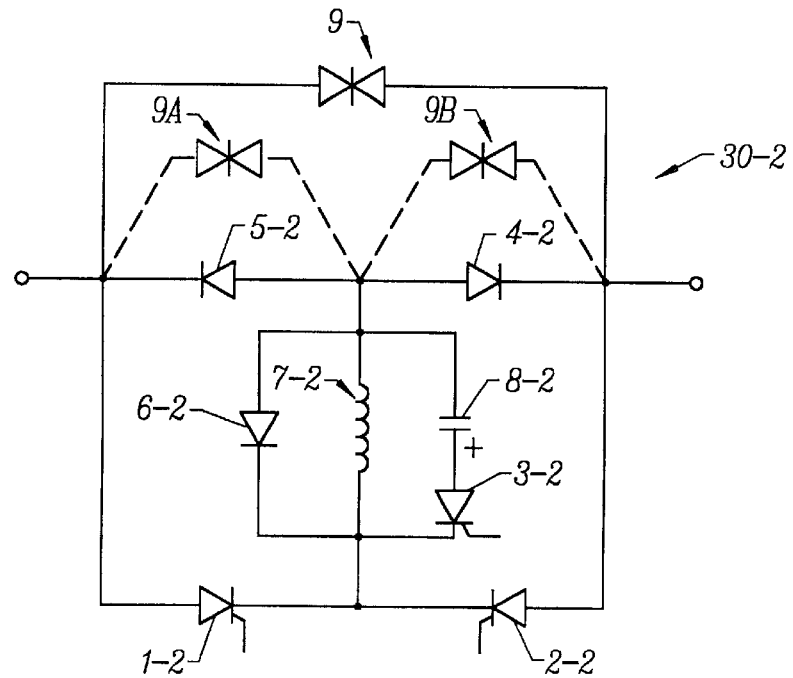
FIG. 8b is a different schematic diagram of a SSCB embodying the present invention which is different than FIG. 1 in that the inductor serves two purposes.

Shown in FIG. 8b is circuit 30-2. The circuit shown is the same as the circuit of FIG. 8 with the addition of one component. That component is energy absorbing device 9. All the other components of FIG. 8b are labeled with the same number as FIG. 8 with a -2. Energy absorbing device 9 could be replaced with energy absorbing devices 9A and 9B.

Circuits of FIGS. 8 and 8a have been described as circuits to be used for switches 22 through 22-4 of FIGS. 1 through 5A. As shown, they can be used as described. With the addition of an energy absorbing device, the circuits of FIGS. 8 and 8a are stand alone SSCB's themselves. Such a circuit, with one possible placement of energy absorbing device 9, is shown in FIG. 8b. Inductor 7-2 of FIG. 8b is used for two purposes. The first is to limit the current during the time between when a fault condition appears on the line and when SCR 3-2 is turned on (i.e. the delay time). The second purpose is to be the device the commutation voltage is applied across during the commutation interval. Note that the energy stored in capacitor 8-2, and inductor 7-2 at the beginning of the commutation interval is not absorbed in energy absorbing device 9, but is absorbed in inductor 7-2 itself and diode 6-2. In the same manner as circuit 20 of FIG. 1, the energy absorbing device 9 still has to absorb the energy stored in the line.

Also note that if diodes 4-2 and 5-2 of circuit 30-2 were avalanche diodes then the energy absorbing device 9 would not necessarily be needed and/or one energy absorbing device could be used across 2 or more series connected AC switches.

One of the determining factors to decide if circuits like FIG. 8 or FIG. 8a should be used for switches 22 through 22-4 or as stand alone SSCB's themselves like FIG. 8b is the coordination of the energy absorbing devices and the SCR's themselves. Coordination means how much higher the clamping voltage of the energy absorbing devices has to be compared to the normally seen voltage. If the ratio is too high then circuits like shown in FIG. 8 and FIG. 8a should be used as switching devices 22 through 22-4 in FIGS. 1 through 5A and not as stand alone breakers. The reason for this is that the number of series connected AC switches for a given voltage rating goes up as the ratio of the clamping voltage to the normal voltage increases.

Figure 9:
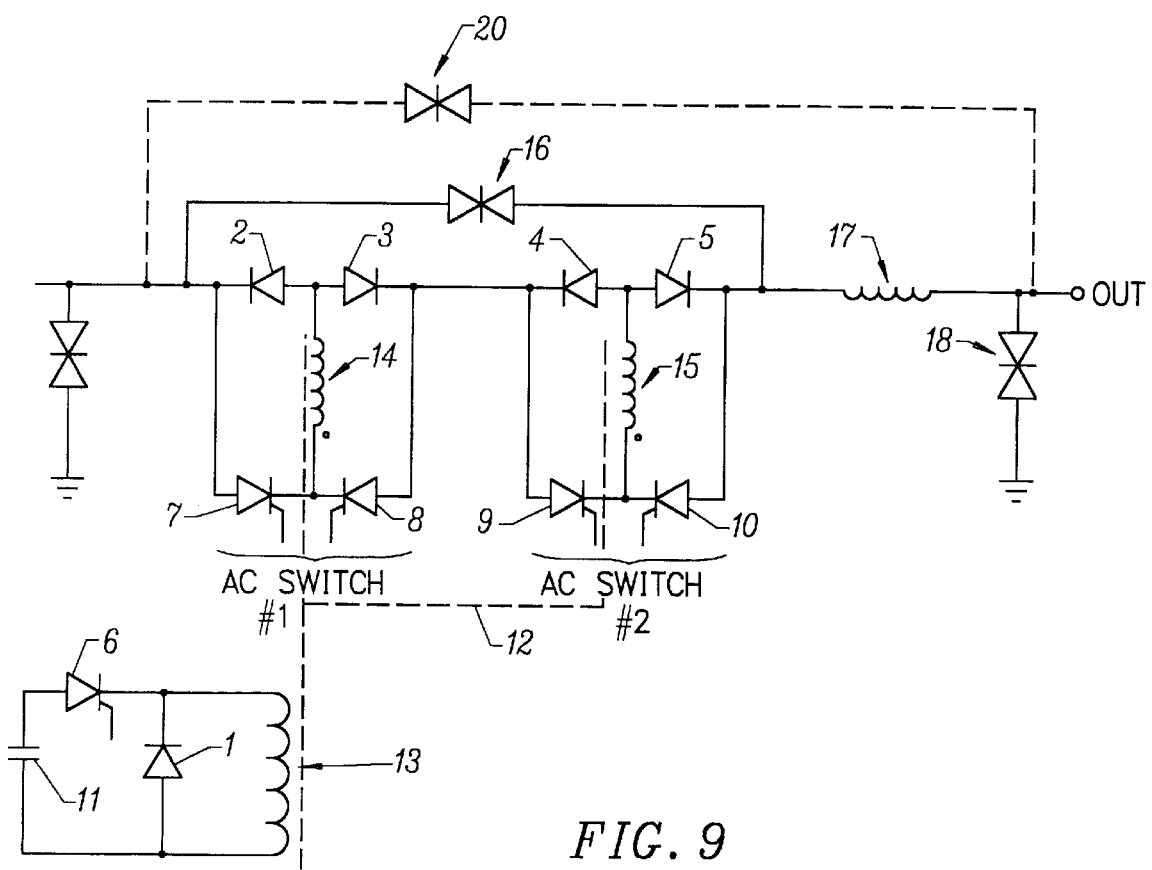
FIG. 9 is a schematic diagram of a single phase SSCB embodying the present invention which shows two series connected AC switches using forced commutated SCR's using only one commutating circuit.

Shown in FIG. 9 is a single phase AC SSCB that has two AC switches in series. The AC switches chosen are forced commutated SCR type similar to the AC switch shown in FIG. 8 with one modification. The circuit shown in FIG. 9 has a common commutation circuit (i.e. only one commutation capacitor—11, one commutation SCR—6, and one freewheeling diode—1, is used for both AC switches 1 and 2). The commutation pulses are transformer coupled through transformer 12 from primary winding 13 to secondary windings 14 and 15.

The sum of the currents in the primary 13 and the two secondaries 14 and 15 in the transformer is kept equal to twice the peak AC current in the same manner as previously described for FIG. 8 except the clamping action is on the primary 13 of transformer 12 through diode 1. If there were 3 secondaries then the total current in the transformer windings would be three times the peak AC current.

Note that diode 1 could be an SCR that is only turned on when SCR 6 is turned on. If that were the case, then the normal line currents would be clamped (or free wheeled) in the secondary sides 14 and 15. Each AC switch would have two clamping paths. In AC switch 1—FIG. 9 the first clamping path would be secondary 14, diode 2 and SCR 7. The second path would be secondary 14 diode 3 and SCR 8. The only time that current would go through the SCR that replaced diode 1 would be at the end of a commutation interval.

In FIG. 9 the peak current in primary 13 is equal to twice the peak AC current (assuming a 1-1-1 turns ratio). If FIG. 9 were a three phase SSCB, still with one commutation circuit, then the peak current in secondary 13 would be much smaller than the total current in the windings (assuming a balanced load). The peak current would be approximately 14% of the peak current times the number of switches in one phase.

Figure 10:
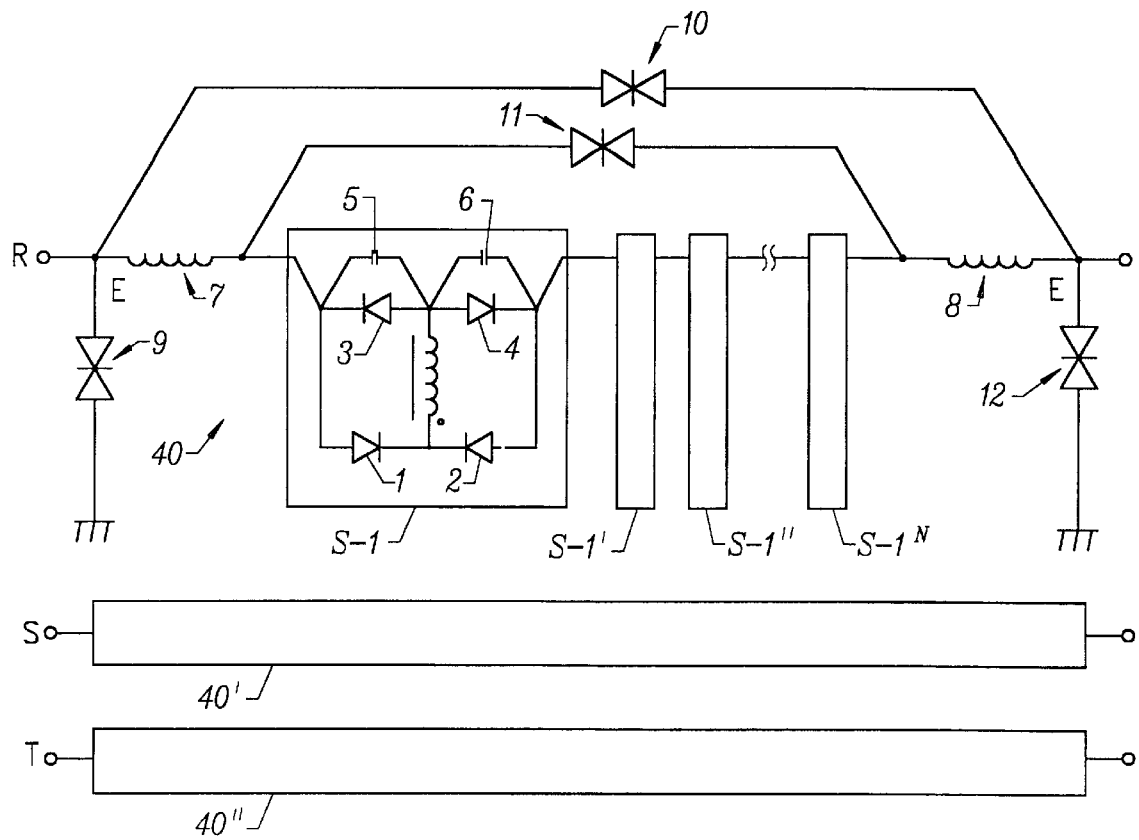
FIG. 10 is a schematic diagram of a three phase high voltage SSCB embodying the present invention using forced commutated SCR's in the AC switches.

Shown in FIG. 10 is three identical circuits labeled 40, 40-1, 40 and 40-2. Together they make up a high voltage three phase SSCB connected to phases R, S and T. The circuit is shown with a number of series connected AC switches with one AC switch S-1 detailed. The circuit has two inductors (7 & 8) with special indicators "E" for the reasons previously described. Further, part of the filtering required for each AC switch is shown with capacitors 5 and 6 and the energy absorbing devices 9, 10, 11 and 12 are symmetrically placed. The circuit is built to withstand lightning strikes and interrupt faults on either side of the SSCB. In some applications being able to interrupt faults on either side of the SSCB is very important.

Figure 10A:
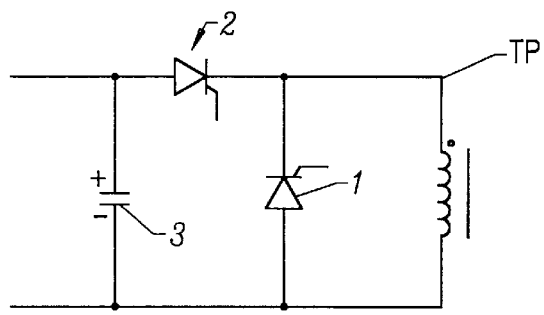
FIG. 10a shows a possible common commutation circuit that could be used to force commutate all the A.C. switches of circuits 40, 40' and 40" in FIG. 10.

Shown in FIG. 10a is one possible common commutation circuit that could be used to force commutate all the AC switches of circuits 40, 40-1 and 40-2 in FIG. 10. The circuit is shown using SCR's 1 and 2 but it could be other type switching devices. Further there could be more than one commutation circuit used in one three phase SSCB. For example, there could be one commutation circuit for each phase. If SCR 1 of FIG. 10a was a diode then the three commutation circuits could be used to turn off ⅓ of the AC switches in each phase. In this way the current in the diode that is replacing SCR 1 in FIG. 10a would be kept at a minimum. Capacitor 3 of FIG. 10a is kept charged with a high impedance DC source. The repetition rate of a circuit like that shown in FIG. 10a is quite low but is satisfactory in some applications.

Figure 10B:
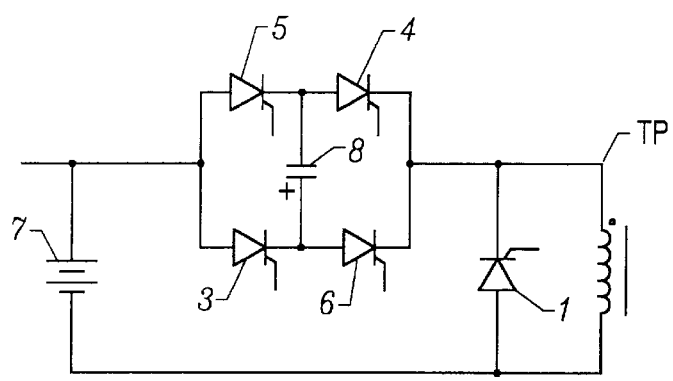
FIG. 10b shows a high-repetition rate commutation circuit.

Shown in FIG. 10b is a high repetition rate commutation circuit that does the exact same thing that the circuit shown in FIG. 10a does but at a much higher repetition rate. This type circuit is well known in the industry and will not be described in detail. Basically, when a commutation pulse is required and capacitor 8 is charged as shown, SCR's 5 and 6 would be fired to start the commutation cycle. At the end of the cycle capacitor 8 would be charged in the opposite polarity shown. When the next cycle begins SCR's 3 and 4 would be fired. With the circuit shown in FIG. 10b commutation cycles can be very close to each other for at least several cycles if not on a continuous basis.

Figure 11:
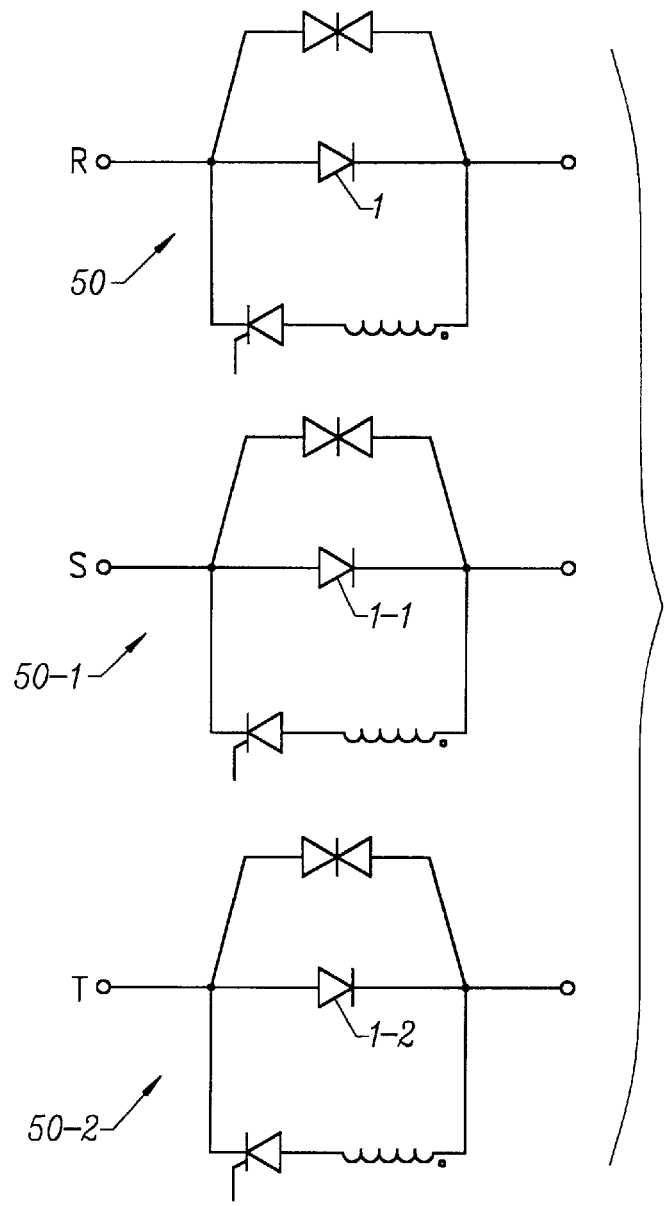
FIG. 11 is a schematic diagram of a low cost three phase SSCB using one AC switch embodying the present invention that requires a floating (i.e.—not grounded) input voltage to the SSCB.
Figure 11A:
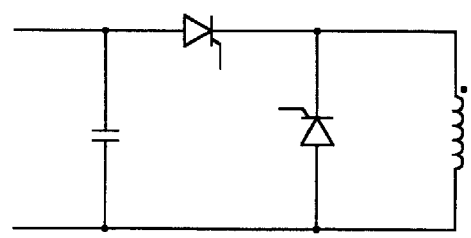
FIG. 11a shows a commutation circuit.

FIG. 11 shows a 3 phase SSCB that requires only one AC switch and further only one SCR and one diode per AC switch. If required, more than one of the AC switches shown could be used in series. The commutation circuit is shown in FIG. 11a and is similar in operation to previously described commutation circuits. The only extra requirement for this lower cost and more efficient SSCB is that the input 3 phase source voltage not be grounded. The output can be grounded without affecting the SSCB.

In the previously described grounded 3 phase SSCB', grounding the output would cause the SSCB to open with a fault. If the 3 phase SSCB shown in FIG. 11 were used in a grounded 3 phase system and the output was grounded with a positive voltage with respect to ground there would be a very high current through one of the diodes 1, 1-1 or 1-2 that the breaker could not interrupt.

In effect, the other SCR type AC switches (i.e.—2 SCR's and two diodes) are just two of the AC switches shown in FIG. 11 connected in the opposite direction and using a common transformer secondary for commutation.

What is claimed is:

1. A method of soft starting a three-phase circuit, comprising the steps of:
    turning on first and second phases of said three-phase circuit and, only if an undesirable first predetermined power condition is not detected, turning on said third phase;
    if said first predetermined power condition is detected, turning off said first and second phases and turning on said third and first phases and, only if an undesirable second predetermined power condition is not detected, turning on said second phase;
    if said second predetermined power condition is detected, turning off said third and first phases and turning on said second and third phases and, only if an undesirable third predetermined power condition is not detected, turning on said first phase; and
    repeating said step of turning on said first and second phases, said step of turning on said third and first phases and said step of turning on said second and third phases, until none of said first, second and third power conditions are detected.

2. A method according to claim 1, wherein said step of turning off said first and second phases if said first predetermined power condition is detected, comprises the step of turning off said first and second phases at the next zero crossing of said first and second phases, respectively, after said first predetermined power condition is detected;
    wherein said step of turning off said third and first phases if said second predetermined power condition is detected, comprises the step of turning off said third and first phases at the next zero crossing of said third and first phases, respectively, after said second predetermined power condition is detected;
    and wherein said step of turning off said second and third phases if said third predetermined power condition is detected, comprises the step of turning off said second and third at the next zero crossing of said second and third phases, respectively, after said third predetermined power condition is detected.

3. A method according to claim 1, where said first predetermined power condition is defined as the earliest to occur of first and second electrical conditions, said first electrical condition being less severe than said second electrical condition,
    wherein said second predetermined power condition is defined as the earliest to occur of third and fourth electrical conditions, said third electrical condition being less severe than said fourth electrical condition,
    wherein said third predetermined power condition is defined as the earliest to occur of fifth and sixth electrical conditions, said fifth electrical condition being less severe than said sixth electrical condition,
    wherein said step of turning off said first and second phases if said first predetermined power condition is detected, includes the steps of:
        causing each of said first and second phases to turn off at the next zero crossing of said first and second phases, respectively, after said first predetermined power condition is detected, if said detected first predetermined power condition is said first electrical condition; and
        cutting off said first, second and third phases quickly in response to detection of said second electrical condition,
    wherein said step of turning off said third and first phases if said second predetermined power condition is detected, includes the steps of:
        causing each of said third and first phases to turn off at the next zero crossing of said third and first phases, respectively, after said second predetermined power condition is detected, if said detected second predetermined power condition is said third electrical condition; and
        cutting off said first, second and third phases quickly in response to detection of said fourth electrical condition,
    and wherein said step of turning off said second and third phases if said third predetermined power condition is detected, includes the steps of:
        causing each of said second and third phases to turn off at the next zero crossing of said second and third phases, respectively, after said third predetermined power condition is detected, if said detected third predetermined power condition is said fifth electrical condition; and
        cutting off said first, second and third phases quickly in response to detection of said sixth electrical condition.

4. A method according to claim 1, wherein said step of turning on first and second phases comprises the step of turning on each of said first and second phases at a zero crossing of each of said first and second phases, respectively,
    wherein said step of turning on third and first phases comprises the step of turning on each of said third and first phases at a zero crossing of each of said third and first phases, respectively,
    and wherein said step of turning on second and third phases comprises the step of turning on each of said second and third phases at a zero crossing of each of said second and third phases, respectively.

5. A method according to claim 4, wherein said step of turning off said first and second phases if said first predetermined power condition is detected, comprises the step of cutting off said first, second and third phases quickly in response to detection of said first predetermined power condition,
    wherein said step of turning off said third and first phases if said second predetermined power condition is detected, comprises the step of cutting off said first, second and third phases quickly in response to detection of said second predetermined power condition,
    and wherein said step of turning off said second and third phases if said third predetermined power condition is detected, comprises the step of cutting off said first, second and third phases quickly in response to detection of said third predetermined power condition.

6. A method according to claim 1, wherein said step of turning on first and second phases comprises the step of turning on each of said first and second phases at a zero crossing of each of said first and second phases, respectively, wherein said step of turning on third and first phases comprises the step of turning on each of said third and first phases at a zero crossing of each of said third and first phases, respectively, and wherein said step of turning on second and third phases comprises the step of turning on each of said second and third phases at a zero crossing of each of said second and third phases, respectively.

7. Electrical power apparatus comprising:

a supply side circuit including a power source and power lines;

a load side circuit including power lines and a load; and a first circuit breaker connected in a first current path between said supply side circuit and said load side circuit at least to protect said supply side circuit from overcurrent conditions in said load side circuit, said first circuit breaker including:

a first bidirectional electronic switch connected in series in said first current path between said power side circuit and said load side circuit;

a first inductor connected in series with said first switch in said first current path and between said power side circuit and said load side circuit, said first inductor having a first inductance; and a control circuit connected to control said first switch, said control circuit turning off said first switch in response to occurrence of a fault in said load side circuit, said control circuit and said first switch having a combined first turn-off delay time, said fault causing current through said first switch to continue increasing during said first turn-off delay time, wherein said first inductance and said first turn-off delay time are such that even if impedance from said first circuit breaker to said fault were zero, and impedance from said power source to said first circuit breaker were zero, instantaneous current level through said first switch during said first turn-off delay time would be limited to a predetermined maximum level which said first switch can handle safely and in spite of which said first switch can turn off.

8. Apparatus according to claim 1, wherein said first inductor consists of a single discrete inductor, substantially all inductance in series with said first switch in said first current path and between said power side circuit and said load side circuit being concentrated in said first inductor.

9. Apparatus according to claim 7, wherein said supply side circuit supplies power to said first circuit breaker with a voltage of at least about 20,000 volts.

10. Apparatus according to claim 9, wherein said first turn-off delay time is at least about 0.5 microseconds.

11. Apparatus according to claim 7, wherein said supply side circuit supplies power to said first circuit breaker with a current level of at least about 600 amps.

12. Apparatus according to claim 11, wherein said first turn-off delay time is at least about 0.5 microseconds.

13. Apparatus according to claim 7, wherein said control circuit turns off said first switch in response to current through said first circuit breaker exceeding a predetermined trip level, and wherein said first insertion inductance is given by $$L \geq E_{max} T_d / \Delta I,$$

where $E_{max}$ is a maximum rated voltage applied to said first circuit breaker by said supply side circuit, $T_d$ is said first turn-off delay time, and $\Delta I$ is said predetermined maximum instantaneous current level minus said predetermined trip level.

14. Apparatus according to claim 7, wherein said first inductor comprises a discrete inductor.

15. Apparatus according to claim 7, wherein said first circuit breaker further comprises an energy absorbing device connected so as to provide an alternative current path across said first circuit breaker, said alternative current path bypassing said first switch, said alternative current path conducting line current through said energy absorbing device after said control circuit turns off said first switch until said line current goes to zero.

16. Apparatus according to claim 15, wherein said energy absorbing device comprises a nonlinear device which conducts substantially no current therethrough unless voltage across said nonlinear device exceeds a predetermined positive threshold voltage.

17. Apparatus according to claim 15, wherein said energy absorbing device has an impedance which decreases substantially when voltage across said device exceeds a predetermined threshold voltage.

18. Apparatus according to claim 15, wherein said first switch comprises a commutatable device having upstream and downstream current path terminals in said first current path, wherein said control circuit turns off said first switch by applying a commutation voltage to said downstream current path terminal of said first switch to force commutate said first switch, and wherein said energy absorbing device has an impedance which decreases substantially when voltage across said device exceeds a predetermined threshold voltage, said threshold voltage of said energy absorbing device being less than said commutation voltage.

19. Apparatus according to claim 15, wherein said first circuit breaker further comprises a first diode which is reverse biased when said control circuit turns off said first switch and a second diode which is forward biased when said control circuit turns off said first switch, and wherein said energy absorbing device is connected such that said alternative current path bypasses said first diode but includes said second diode.

20. Apparatus according to claim 15, wherein said first circuit breaker further comprises a first diode which is reverse biased when said control circuit turns off said first switch and a second diode which is forward biased when said control circuit turns off said first switch, and wherein said energy absorbing device is connected such that said alternative current path bypasses both said first and second diodes.

21. Apparatus according to claim 7, wherein said first circuit breaker further includes a second electronic switch connected in series in said second current path between said power side circuit and said load side circuit, and wherein said control circuit is further connected to control said second switch, said control circuit turning off also said second switch in response to occurrence of said fault in said load side circuit.

22. Apparatus according to claim 7, wherein said supply side circuit and said load side circuit are each three-phase circuits, said first current path carrying a first of said phases, further comprising:

a second switch connected in a second current path between said supply side circuit and said load side circuit, said second current path carrying a second of said phases; and a third switch connected in a third current path between said supply side circuit and said load side circuit, said third current path carrying a third of said phases, wherein said control circuit is further connected to control said second and third switches, said control circuit turning off also said second and third switches in response to occurrence of said fault in said load side circuit.

23. Apparatus according to claim 22, wherein said first circuit breaker further includes a fourth electronic switch connected in series in said second current path between said power side circuit and said load side circuit, further comprising:

a fifth switch connected in said second current path between said supply side circuit and said load side circuit; and a sixth switch connected in said third current path between said supply side circuit and said load side circuit, and wherein said control circuit is further connected to control said fourth, fifth and sixth switches, said control circuit turning off also said fourth, fifth and sixth switches in response to occurrence of said fault in said load side circuit.

24. A circuit breaker for connection in a current path between first and second power circuits, comprising:

a switch connected in series in said current path;

a control circuit connected to control said switch, said control circuit turning off said switch in response to a predetermined electrical condition detected in said power circuits, said control circuit and said switch having a combined turn-off delay time; and a current increase prevention circuit, said current increase prevention circuit introducing an inductance in series in said current path in response to said predetermined electrical condition and prior to expiration of said combined turn-off delay time.

25. A circuit breaker according to claim 24, wherein said predetermined electrical condition is detected in said second power circuit, and wherein said inductance and said turn-off delay time are such that even if said predetermined electrical condition were to be caused by a sudden zero-impedance short in said second power circuit measured at said circuit breaker, and impedance in said first power circuit measured at said circuit breaker were zero, current flow through said switch during said combined turn-off delay time would be limited to a predetermined maximum level which said switch can handle safely and in spite of which said switch can turn off.

26. A circuit breaker according to claim 24, wherein said current increase prevention circuit introduces said inductance in series in said current path passively in response to said predetermined electrical condition and prior to expiration of said combined turn off delay time.

27. A circuit breaker according to claim 24, wherein said current increase prevention circuit comprises:

an inductor connected in series in said current path; and a circuit which maintains a substantially fixed voltage drop across said inductor unless current through said current path exceeds a predetermined maximum current level.

28. A circuit breaker according to claim 24, wherein said current increase prevention circuit comprises:

an inductor connected in series in said current path;

rectification circuitry which allows current flow through said inductor only in one direction; and a uni-directional current flow element connected in a reverse current path shunting said inductor, said uni-directional current flow element allowing current flow only in a direction opposite said one direction.

29. A circuit breaker according to claim 25, wherein said rectification circuitry is full wave rectification circuitry.

30. A circuit breaker according to claim 25, wherein said rectification circuitry includes said switch.

31. A circuit breaker according to claim 25, wherein said current increase prevention circuit further comprises:

a DC power source having a more positive terminal and a more negative terminal, said DC power source being connected in series with said inductor to form a series combination, said rectification circuitry allowing current flow through said entire series combination in said only one direction, said DC power source being oriented such that its more positive terminal is downstream of its more negative terminal in said only one direction, and wherein said reverse current path shunts said entire series combination.

32. A circuit breaker according to claim 24, wherein said current increase prevention circuit introduces said inductor in series in said current path also at each current flow peak in said current path.

33. A circuit breaker according to claim 24, wherein said switch comprises a force commutatable device and said inductance comprises an inductor in series with said device, and wherein said control circuit comprises a commutation voltage source which applies a commutation voltage to a node in said current path between said commutatable device and said inductor in response to said predetermined electrical condition detected in said power circuits.

34. A circuit breaker according to claim 33, wherein said commutation voltage source comprises a charged capacitor, and wherein said capacitor and said inductor are large enough, and said turn off delay time is short enough, such that after said commutation voltage source applies said commutation voltage to said node, said commutatable device remains reversed biased for long enough to turn off before said capacitor discharges through said inductor.

35. A circuit breaker according to claim 34, wherein said predetermined electrical condition is detected in said second power circuit, and wherein said inductance and said turn off delay time further are such that even if said predetermined electrical condition were to be caused by a sudden zero-impedance short in said second power circuit measured at said circuit breaker, and impedance in said first power circuit measured at said circuit breaker were zero, current flow through said switch during said combined turn-off delay time would be limited to a predetermined maximum level which said switch can handle safely and in spite of which said switch can turn off.

36. A circuit breaker according to claim 24, further comprising an energy absorbing device connected so as to provide an alternative current path across said circuit breaker, said alternative current path bypassing said switch, said alternative current path conducting line current through said energy absorbing device after said control circuit turns off said switch until said line current goes to zero.

37. A circuit breaker according to claim 36, wherein said switch comprises a commutatable device having upstream and downstream current path terminals in said current path, wherein said control circuit turns off said switch by applying a commutation voltage to said downstream current path terminal of said switch to force commutate said switch, and wherein said energy absorbing device has an impedance which decreases substantially when voltage across said device exceeds a predetermined threshold voltage, said threshold voltage of said energy absorbing device being less than said commutation voltage.

38. A method for operating a subject circuit breaker connected between an upstream power supply circuit and a downstream circuit, comprising the steps of:

supplying power from said upstream power supply circuit to said downstream circuit through said subject circuit breaker;

cutting off power from said upstream power supply circuit to said downstream circuit in response to occurrence of a fault causing an over current condition detected in said downstream circuit;

subsequently to said step of cutting off, resuming supplying power to said downstream circuit for at least a downstream clearing period while said fault remains; and actively limiting current flow through said subject circuit breaker during said downstream clearing period to a predetermined safe level.

39. A method according to claim 38, wherein said subject circuit breaker comprises a subject switch connected in series between said upstream power supply circuit and said downstream circuit, said switch having a subject cut-off delay time, wherein said step of cutting off power comprises the steps of:

controlling said subject switch to turn off; and passively limiting current flow through said subject switch during said subject cut-off delay time after said step of controlling.

40. A method according to claim 39, wherein said downstream circuit has a downstream circuit clearing time which is longer than said subject cut-off delay time.

41. A method according to claim 40, wherein said downstream circuit clearing time further is shorter than said downstream clearing period.

42. A method according to claim 39, wherein said downstream circuit has a downstream circuit clearing time which is longer than said subject cut-off delay time but shorter than said downstream clearing period, and wherein said steps of resuming and limiting collectively comprise the step of supplying power from said upstream power supply to said downstream circuit with electrical characteristics which are sufficient to cause said downstream circuit, within said downstream clearing period, to clear.

43. A method according to claim 38, wherein said step of actively limiting comprises the step of repeating said steps of cutting off power and resuming supplying power, until said downstream clearing period ends.

44. A method according to claim 43, wherein said subject circuit breaker comprises a force-commutatable switch connected in series between said upstream power supply circuit and said downstream circuit, and wherein said step of cutting off power comprises the step of force-commutating said switch.

45. A method according to claim 38, wherein said subject circuit breaker comprises a force-commutatable switch connected in series between said upstream power supply circuit and said downstream circuit, and wherein said step of cutting off power comprises the step of force-commutating said switch.

46. A method according to claim 38, wherein said step of actively limiting comprises the step of phase controlling said current flow through said subject circuit breaker during said downstream clearing period.

47. A method according to claim 46, wherein said step of actively limiting further comprises the step of repeating said steps of cutting off power and resuming supplying power, until said downstream clearing period ends.

48. A method according to claim 38, wherein said downstream circuit is a three-phase circuit, and wherein said steps of resuming and actively limiting collectively comprise soft-start steps of:

turning on first and second phases of said three-phase circuit at zero-crossings of respectively said first and second phases;

only if a first predetermined undesirable power condition is not detected while said first and second phases are on, turning on said third phase at a zero-crossing of said third phase;

if said first predetermined current condition is detected, turning off said first and second phases at zero-crossings of respectively said first and second phases and turning on said third and first phases at zero-crossings of respectively said third and first phases;

only if a second predetermined undesirable power condition is not detected while said third and first phases are on, turning on said second phase at a zero-crossing of said second phase;

if said second predetermined current condition is detected, turning off said third and first phases at zero-crossings of respectively said third and first phases and turning on said second and third phases at zero-crossings of respectively said second and third phases;

only if a third predetermined undesirable power condition is not detected while said second and third phases are on, turning on said first phase at a zero-crossing of said first phase; and repeating said step of turning on said first and second phases, said step of turning on said third and first phases and said step of turning on said second and third phases, until none of said first, second and third power conditions are detected.

49. A method according to claim 48, further comprising the step of performing said soft-start steps after said fault is cleared.

50. A method for use with a supply side circuit including a power source and power lines, and a load side circuit including power lines and a load, at least for protecting said supply side circuit from over current conditions in said load side circuit, comprising the steps of:

connecting a bidirectional switch in series between said power side circuit and said load side circuit;

connecting an inductor in series with said switch and between said power side circuit and said load side circuit, said inductor having an inductance; and connecting a control circuit to said switch, said control circuit turning off said switch in response to occurrence of a fault in said load side circuit, said control circuit and said switch having a combined turn-off delay time, said fault causing current through said switch to continue increasing during said turn-off delay time, wherein said inductance and said turn-off delay time are such that even if impedance from said switch to said fault were zero, and impedance from said power source to said switch were zero, instantaneous current level through said switch during said turn-off delay time would be limited to a predetermined maximum level which said switch can handle safely and in spite of which said switch can turn off.

51. A method of designing a circuit breaker for connection between a supply side circuit including a power source and power lines, and a load side circuit including power lines and a load, said circuit breaker including a bidirectional switch to be connected in series between said power side circuit and said load side circuit; an inductance to be connected in series with said bidirectional switch and between said power side circuit and said load side circuit; and a control circuit connected to control said bidirectional switch, said control circuit turning off said bidirectional switch in response to occurrence of a fault in said load side circuit, comprising the steps of:

selecting said bidirectional switch and said control circuit;

determining a combined turn-off delay time of said control circuit and said bidirectional switch; and selecting said inductance to be large enough such that even if impedance from said bidirectional switch to said fault were zero, and impedance from said power source to said bidirectional switch were zero, instantaneous current level through said bidirectional switch during said turn-off delay time would be limited to a predetermined maximum level which said bidirectional switch can handle safely and in spite of which said bidirectional switch can turn off.

52. A method according to claim 51, wherein said step of selecting comprises the step of including an inductor in series between said power side circuit and said load side circuit, said inductor itself having said large enough inductance.

53. A method according to claim 51, further comprising the step of ensuring that said inductance is small enough such that voltage drops across said inductance by no more than a predetermined maximum voltage drop at a predetermined nominal current level.

54. Electrical power apparatus comprising:

a supply side circuit including a D.C. power source and power lines;

a load side circuit including power lines and a load; and a first circuit breaker connected in a first current path between said supply side circuit and said load side circuit at least to protect said supply side circuit from overcurrent conditions in said load side circuit, said first circuit breaker including:

a first electronic switch connected in series in said first current path between said power side circuit and said load side circuit;

a first inductor connected in series with said first switch in said first current path and between said power side circuit and said load side circuit, said first inductor having a first inductance; and a control circuit connected to control said first switch, said control circuit turning off said first switch in response to occurrence of a fault in said load side circuit, said control circuit and said first switch having a combined first turn-off delay time, said fault causing current through said first switch to continue increasing during said first turn-off delay time, wherein said first inductance and said first turn-off delay time are such that even if impedance from said first circuit breaker to said fault were zero, and impedance from said power source to said first circuit breaker were zero, instantaneous current level through said first switch during said first turn-off delay time would be limited to a predetermined maximum level which said first switch can handle safely and in spite of which said first switch can turn off.

55. Apparatus according to claim 54, wherein said control circuit turns off said first switch in response to current through said first circuit breaker exceeding a predetermined trip level, and wherein said first insertion inductance is given by $$L \geq E_{max} T_d / \Delta I,$$

where $E_{max}$ is a maximum rated voltage applied to said first circuit breaker by said supply side circuit, $T_d$ is said first turn-off delay time, and $\Delta I$ is said predetermined maximum instantaneous current level minus said predetermined trip level.

56. Apparatus according to claim 54, wherein said first inductor comprises a discrete inductor.

57. Apparatus according to claim 54, wherein said first circuit breaker further comprises an energy absorbing device connected so as to provide an alternative current path across said first circuit breaker, said alternative current path bypassing said first switch, said alternative current path conducting line current through said energy absorbing device after said control circuit turns off said first switch until said line current goes to zero.

58. Apparatus according to claim 57, wherein said energy absorbing device comprises a nonlinear device which conducts substantially no current therethrough unless voltage across said nonlinear device exceeds a predetermined positive threshold voltage.

59. Apparatus according to claim 57, wherein said energy absorbing device has an impedance which decreases substantially when voltage across said device exceeds a predetermined threshold voltage.

60. Apparatus according to claim 57, wherein said first switch comprises a commutatable device having upstream and downstream current path terminals in said first current path, wherein said control circuit turns off said first switch by applying a commutation voltage to said downstream current path terminal of said first switch to force commutate said first switch, and wherein said energy absorbing device has an impedance which decreases substantially when voltage across said device exceeds a predetermined threshold voltage, said threshold voltage of said energy absorbing device being less than said commutation voltage.

61. A method of designing a circuit breaker for connection between a supply side circuit including a D.C. power source and power lines, and a load side circuit including power lines and a load, said circuit breaker including a switch to be connected in series between said power side circuit and said load side circuit; an inductance to be connected in series with said switch and between said power side circuit and said load side circuit; and a control circuit connected to control said switch, said control circuit turning off said switch in response to occurrence of a fault in said load side circuit, comprising the steps of:

selecting said switch and said control circuit;

determining a combined turn-off delay time of said control circuit and said switch; and selecting said inductance to be large enough such that even if impedance from said switch to said fault were zero, and impedance from said power source to said switch were zero, instantaneous current level through said switch during said turn-off delay time would be limited to a predetermined maximum level which said switch can handle safely and in spite of which said switch can turn off.

62. A method according to claim 61, wherein said step of selecting comprises the step of including an inductor in series between said power side circuit and said load side circuit, said inductor itself having said large enough inductance.

63. A method according to claim 62, further comprising the step of ensuring that said inductance is small enough such that voltage drops across said inductance by no more than a predetermined maximum voltage drop at a predetermined nominal current level.

* * * * *

UNITED STATES PATENT AND TRADEMARK OFFICE
CERTIFICATE OF CORRECTION

PATENT NO. : 6,104,106
DATED : August 15, 2000
INVENTOR(S) : Donald F. Partridge It is certified that error appears in the above-identified patent and that said Letters Patent is hereby corrected as shown below:

Column 11,
Line 19, please add the following four paragraphs:

-- Some of the characteristics of preferred embodiments include a switching circuit containing a series circuit including a switching device in series with a passive current limiter. The switching device can be turned on or off. The circuit also includes a source of voltage connected to the series circuit, a load connected to the series circuit and at least one energy absorber connected to the series circuit. The circuit can include an active current limiter, which can include phase controlled on and off systems. The off system can include a second off system that is much quicker than the phase controlled off system. The second off system can be run at a high frequency. The switching device can be a GTO or an SCR, and it can be forced commutated. Alternatively, the switching device can be a MCT.

In the circuit, the passive current limiter can be one or more inductors, which can be constructed to withstand very high dv/dt stresses. The inductor can be decoupled unless the load current goes above the design level of the switching circuit. It can be decoupled at all times in AC applications except when the current is at its peak value.

Numerous series connected forced commutated AC switches can be used, and the switching circuit can be made symmetrical mechanically and electrically. Where the switching device includes a forced commutated SCR, only one SCR and one diode are required for an AC switch in AC applications. The AC switch circuit requires a floating or non?grounded input. Alternatively, more than one SCR and/or SCR forced commutated AC switches, or GTO's, can be turned off from one common commutation circuit.

The current limiter can be used to limit transformer inrush currents or to limit motor starting currents. The active current limiter, when working with 3 phase circuits, can include turning on only 2 phases initially and the third phase later in the cycle if no current limit is detected in the first two phases turned on. --

UNITED STATES PATENT AND TRADEMARK OFFICE
CERTIFICATE OF CORRECTION

PATENT NO. : 6,104,106
DATED : August 15, 2000
INVENTOR(S) : Donald F. Partridge It is certified that error appears in the above-identified patent and that said Letters Patent is hereby corrected as shown below:

Column 16,
Lines 11, 13 and 15, please replace "25" with -- 28 --.

Signed and Sealed this

Eighteenth Day of June, 2002

Attest:

Attesting Officer

JAMES E. ROGAN
*Director of the United States Patent and Trademark Office*